United States Patent
Lu

(10) Patent No.: US 12,278,629 B2
(45) Date of Patent: Apr. 15, 2025

(54) DELAY CIRCUIT AND MEMORY

(71) Applicant: CHANGXIN MEMORY TECHNOLOGIES, INC., Hefei (CN)

(72) Inventor: Tianchen Lu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 81 days.

(21) Appl. No.: 18/155,212

(22) Filed: Jan. 17, 2023

(65) Prior Publication Data

US 2023/0378956 A1    Nov. 23, 2023

Related U.S. Application Data

(63) Continuation of application No. PCT/CN2022/100189, filed on Jun. 21, 2022.

(51) Int. Cl.
*H03K 19/0175* (2006.01)
*G11C 7/10* (2006.01)
*G11C 7/22* (2006.01)

(52) U.S. Cl.
CPC ..... *H03K 19/017509* (2013.01); *G11C 7/109* (2013.01); *G11C 7/222* (2013.01)

(58) Field of Classification Search
CPC .... H03K 19/017509; H03K 5/04; H03K 5/05; H03K 5/06; H03K 21/023; H03K 21/026; H03K 21/10; H03K 23/40; G11C 7/109; G11C 7/222
See application file for complete search history.

(56) References Cited

U.S. PATENT DOCUMENTS

| | | | | |
|---|---|---|---|---|
| 7,545,191 B2 * | 6/2009 | Austin | ........... | H03K 23/667 |
| | | | | 327/175 |
| 8,736,318 B2 * | 5/2014 | Chen | ........... | H03K 23/40 |
| | | | | 327/117 |
| 10,063,234 B1 * | 8/2018 | Mazumder | ..... | H03K 19/017509 |
| 10,121,524 B1 * | 11/2018 | Kim | ........... | G11C 7/1084 |
| 10,657,081 B2 * | 5/2020 | Schaefer | ........... | G06F 5/06 |
| 10,868,541 B1 * | 12/2020 | Choi | ........... | H04N 25/616 |

(Continued)

FOREIGN PATENT DOCUMENTS

| CN | 104079267 A | 10/2014 |
|---|---|---|
| CN | 106712747 A | 5/2017 |

(Continued)

*Primary Examiner* — Menatoallah Youssef
*Assistant Examiner* — Colleen J O Toole
(74) *Attorney, Agent, or Firm* — Syncoda LLC; Feng Ma

(57) ABSTRACT

A delay circuit includes a self-shielding circuit and a delay. The self-shielding circuit is configured to: receive an initial command signal and N initial clock signals, register the initial command signal according to a first initial clock signal among the N initial clock signals that triggers the initial command signal at earliest, shield other N−1 second initial clock signals, and output N intermediate command signals, where N is an integer greater than or equal to 2, and the N initial clock signals have a same frequency and different phases. The delay is electrically connected to the self-shielding circuit and is configured to: receive the N intermediate command signals and the N initial clock signals, and delay and output the N intermediate command signals to obtain a delayed command signal. Thus, the accuracy of signal processing can be improved.

18 Claims, 14 Drawing Sheets

(56) References Cited

U.S. PATENT DOCUMENTS

2007/0288184 A1   12/2007  Konishi
2014/0292386 A1   10/2014  Toriumi
2019/0086949 A1    3/2019  Kamiya

FOREIGN PATENT DOCUMENTS

| CN | 109450545 A | 3/2019 |
| CN | 110574111 A | 12/2019 |
| JP | 2004247771 A | 9/2004 |

* cited by examiner

DELAY CIRCUIT AND MEMORY

CROSS-REFERENCE TO RELATED APPLICATIONS

This is a continuation of International Application No. PCT/CN2022/100189 filed on Jun. 21, 2022, which claims priority to Chinese Patent Application No. 202210557966.X filed on May 19, 2022. The disclosures of the above-referenced applications are hereby incorporated by reference in their entirety.

BACKGROUND

In chips, a frequency of clock signal is one of the important indicators of chip performance. With the continuous development of integrated circuit technologies, the frequency of a clock signal in the chip is also increasing. For example, the frequency of the clock signal under $5^{th}$ generation double data rate (DDR5) specification is double that under $4^{th}$-generation double data rate (DDR4) specification. However, the higher the signal frequency, the worse anti-interference ability of the chip has. Therefore, increase in the frequency of the clock signal also makes the signal processing performed based on the clock signal have a greater error probability.

Therefore, during processing some signals, such as registering and delaying command signals, a frequency division clock signal can be used. Since the frequency of the frequency division clock signal is lower than the frequency of the clock signal, the error probability can be reduced.

SUMMARY

The present disclosure relates to the field of memory integrated circuits, in particular to a delay circuit and a memory.

The technical solutions of the embodiments of the present disclosure are realized as following.

The embodiments of the present disclosure provide a delay circuit. The delay circuit includes: a self-shielding circuit, configured to: receive an initial command signal and N initial clock signals, register the initial command signal according to a first initial clock signal among the N initial clock signals that triggers the initial command signal at earliest, shield other N−1 second initial clock signals among the N initial clock signals, and output N intermediate command signals, where N is an integer greater than or equal to 2, and the N initial clock signals have a same frequency and different phases; and a delay, electrically connected to the self-shielding circuit, and configured to: receive the N intermediate command signals and the N initial clock signals, and delay and output the N intermediate command signals to obtain a delayed command signal.

The embodiments of the present disclosure also provide a memory including a delay circuit. The delay circuit includes: a self-shielding circuit, configured to: receive an initial command signal and N initial clock signals, register the initial command signal according to a first initial clock signal among the N initial clock signals that triggers the initial command signal at earliest, shield other N−1 second initial clock signals among the N initial clock signals, and output N intermediate command signals, where N is an integer greater than or equal to 2, and the N initial clock signals have a same frequency and different phases; and a delay, electrically connected to the self-shielding circuit, and configured to: receive the N intermediate command signals and the N initial clock signals, and delay and output the N intermediate command signals to obtain a delayed command signal.

DETAILED DESCRIPTION

In order to make the objectives, technical solutions and advantages of the present disclosure clearer, the technical solutions of the present disclosure will be further elaborated below in conjunction with the accompanying drawings and embodiments, and the described embodiments should not be construed as limiting the present disclosure. All other embodiments obtained by those of ordinary skill in the art without creative efforts fall within the protection scope of the present disclosure.

In the following description, the term "some embodiments" is referenced to describe a subset of all possible embodiments. However, it is understood that "some embodiments" may be the same subset or different subsets of all possible embodiments, and may be combined with each other without conflict.

If a similar description of "first/second" appears in the disclosure, the following explanation will be added. In the following description, the term "first/second/third" involved is only to distinguish similar objects, and does not represent a specific order of objects. It is understood that the "first/second/third" may be interchanged in a specific order or sequence, where permitted, to enable the embodiments of the disclosure described herein to be implemented in an order other than that illustrated or described herein.

Unless otherwise defined, all technical and scientific terms used herein have the same meanings as commonly understood by those skilled in the art of the present disclosure. The terminology used herein is for the purpose of describing the embodiments of the present disclosure only, which is not intended to limit the present disclosure.

Figure 1:
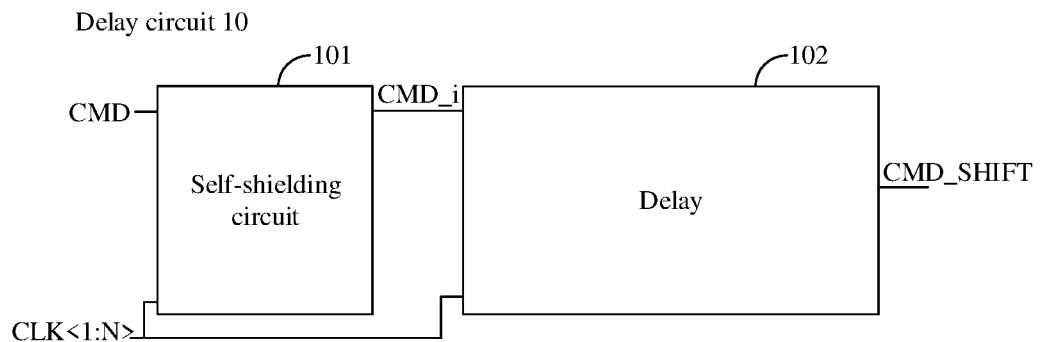
FIG. 1 illustrates a first schematic structural diagram of a delay circuit according to embodiments of the present disclosure.

FIG. 1 illustrates a schematic structural diagram of a delay circuit according to embodiments of the present disclosure. As illustrated in FIG. 1, a delay circuit 10 is provided by the embodiment of the present disclosure, and the delay circuit 10 includes a self-shielding circuit 101 and a delay 102. The self-shielding circuit 101 is configured to receive an initial command signal CMD and N initial clock signals CLK<1: N> (i.e., initial clock signals CLK<1>~CLK<N>), register the initial command signal CMD according to a first initial clock signal among the N initial clock signals CLK<1:N> that triggers the initial command signal CMD at earliest, shield other N−1 second initial clock signals among the N initial clock signals CLK<1:N>, and output N intermediate command signals CMD_i (i is greater than or equal to 1, and less than or equal to N). Here, N is an integer greater than or equal to 2, and the N initial clock signals have the same frequency as each other and have phases different from one another.

The delay 102 is electrically connected to the self-shielding circuit 101. The delay 102 is configured to receive the N intermediate command signals CMD_i and the N initial clock signals CLK<1:N>, and delay and output the N intermediate command signals according to the N initial clock signals CLK<1:N> to obtain a delayed command signal CMD_SHIFT.

In embodiments of the present disclosure, the initial clock signal may be a frequency division clock signal. The frequency division clock signal is obtained by dividing the clock signal in the chip, and has a period being a multiple of the period of the clock signal. For example, the period of a frequency four-division clock signal is four times of the period of the clock signal. That is, the frequency of the frequency four-division clock signal is one quarter of the frequency of the clock signal. For another example, the period of an odd-even frequency division clock signal (i.e., a frequency two-division clock signal) is twice the period of the clock signal. That is, the frequency of odd-even frequency division clock signal is half of the frequency of the clock signal. In usage, multiple frequency division clock signals with different phases can be used at the same time to satisfy various requirements.

Figure 2:
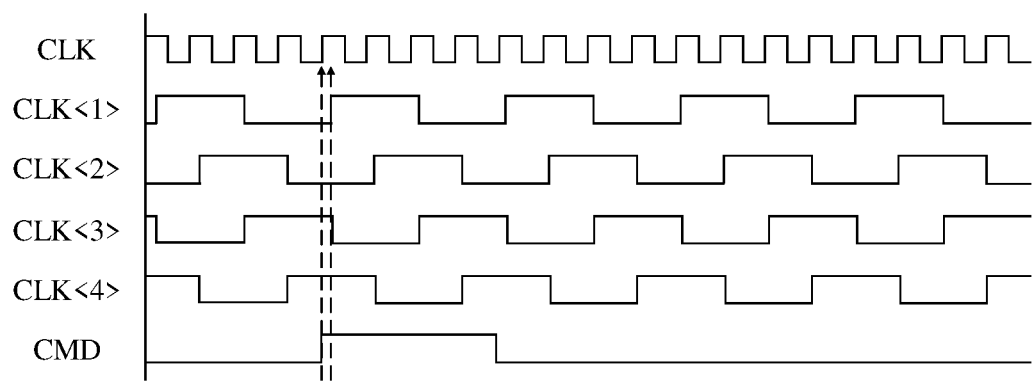
FIG. 2 illustrates a first schematic signal diagram of a delay circuit according to embodiments of the present disclosure.

It should be noted that the initial command signal may be valid at a high level or valid at a low level. For example, in a memory, a "read command" is generally valid at the high level, and a "write command" is generally valid at the low level, and the present disclosure is not limited herein. The command signal CMD illustrated in FIG. 2 is valid at the high level. As illustrated in FIG. 2, in a normal state, the initial command signal CMD is valid at the low level, and the initial command signal CMD plays a control function when containing a high-level pulse.

In embodiments of the present disclosure, in the self-shielding circuit 101, the initial command signal CMD is registered by triggering. Since the phases of the N initial clock signals CLK<1:N> are different, the timings when the N initial clock signals CLK<1:N> arrive a triggering edge corresponding to the initial command signal CMD are different. Taking FIG. 2 as an example, the initial clock signals CLK<1>, CLK<2>, CLK<3> and CLK<4> are frequency four-division signals of the clock signal CLK, and their phases differ by 90 degrees successively. At the same time, the initial command signal CMD is triggered by a rising edge. Then, in an effective pulse width of the initial command signal CMD, the initial clock signal CLK<1> reaches the rising edge (as illustrated by the dashed arrow in FIG. 2) at earliest. That is, the initial clock signal CLK<1> is the one that reaches the triggering edge corresponding to the initial command signal CMD at earliest and becomes the first initial clock signal.

It should be noted that the initial command signal CMD may also be set to be triggered by a falling edge. In the effective pulse width of the initial command signal CMD, the initial clock signal that reaches the falling edge at earliest becomes the first initial clock signal, which will not be limited herein.

In embodiments of the present disclosure, the self-shielding circuit 101 may shield the second initial clock signals among the N initial clock signals CLK<1:N> other than the first initial clock signal. Here, shielding the second initial clock signals means that the second initial clock signals will not trigger registering of the initial command signal CMD.

In embodiments of the present disclosure, the effective pulse width of the command signal is greater than or equal to a period length of each of the initial clock signals, so that each of the initial clock signals can reach the triggering edge at least once in the effective pulse width of the command signal. Thereby, it can be ensured that the command signal can always be registered and delayed by the delay circuit according to the embodiment of the present disclosure.

It can be understood that the delay circuit provided by the present disclosure controls the registration and delay of the command signal only through the first initial clock signal, and shields the second initial clock signals. Thus, the error caused by the simultaneous action of the N initial clock signals can be avoided, and the accuracy of signal processing can be improved. Meanwhile, since the delay circuit provided by the present disclosure registers the command signal according to the first initial clock signal among the N initial clock signals that triggers the command signal at earliest, it can be ensured that the delay produced by registering the command signal is the shortest. That is, the relative delay between the delayed command signal and the command signal is shortened.

Figure 3:
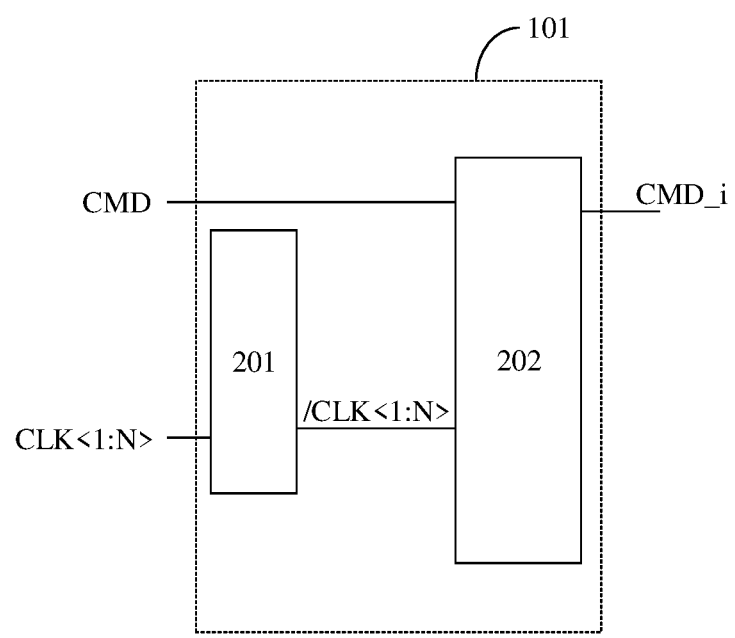
FIG. 3 illustrates a second schematic structural diagram of a delay circuit according to embodiments of the present disclosure.

In some embodiments of the disclosure, as illustrated in FIG. 3, the self-shielding circuit 101 includes a shielding circuit 201 and a register 202. The shielding circuit 201 is configured to receive the N initial clock signals CLK<1:N>, shield other N−1 second initial clock signals among the N initial clock signals CLK<1:N>, and output N intermediate clock signals /CLK<1:N> (i.e., intermediate clock signals /CLK<1>~/CLK<N>). Here, the N intermediate clock signals /CLK<1:N> include a first intermediate clock signal that is valid and N−1 second intermediate clock signals that are invalid.

The register 202 is electrically connected to the shielding circuit 201. The register 202 is configured to receive the initial command signal CMD and the N intermediate clock signals /CLK<1:N>, register the initial command signal CMD according to the first intermediate clock signal, and obtain and output the N intermediate command signals CMD_i.

In embodiments of the present disclosure, the first intermediate clock signal is a valid signal, that is, the first intermediate clock signal can trigger registering of the initial command signal CMD. The first intermediate clock signal has the same waveform as the first initial clock signal, that is, the first initial clock signal triggers the registering of the initial command signal CMD. N−1 second intermediate clock signals are invalid signals, that is, none of the N−1 second intermediate clock signals can trigger registering of the initial command signal CMD. The N−1 second intermediate clock signals correspond to the N−1 second initial clock signals, that is, the action of the N−1 second initial clock signals is shielded.

It can be understood that the shielding circuit shields the action of the N−1 second initial clock signals, and the register controls the registering of the command signal only by the first initial clock signal. Thus, the error caused by the simultaneous action of the N initial clock signals can be avoided and the accuracy of signal processing can be improved.

Figure 4:
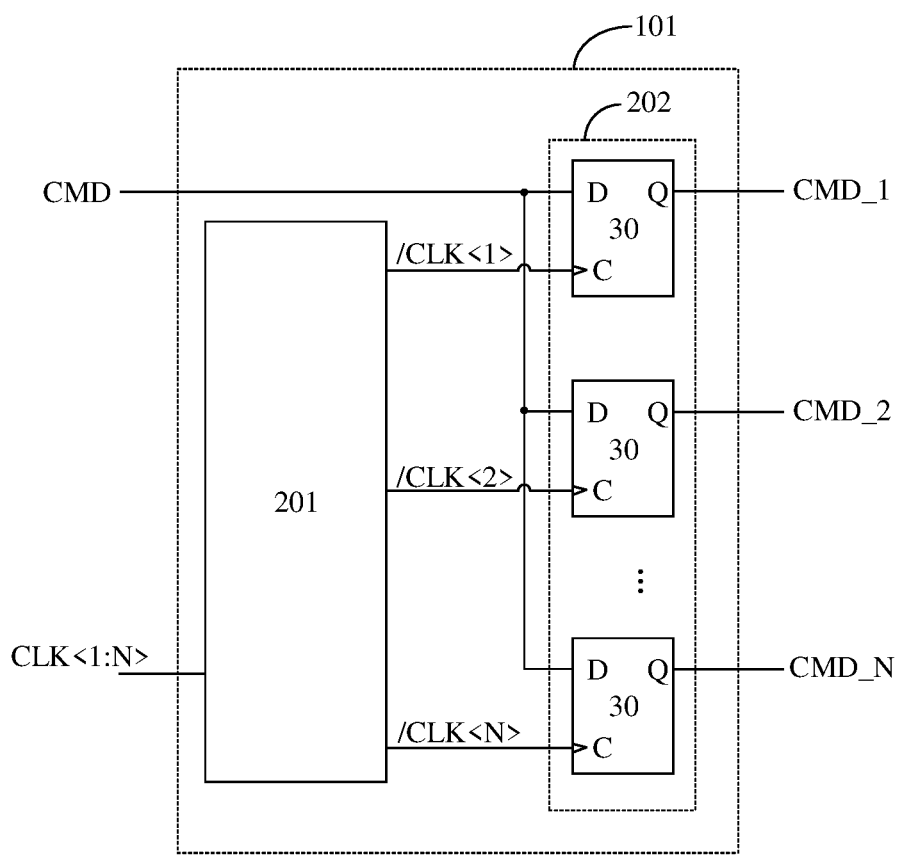
FIG. 4 illustrates a third schematic structural diagram of a delay circuit according to embodiments of the present disclosure.

In some embodiments of the present disclosure, as illustrated in FIG. 4, the register 202 includes N self-shielding triggers 30. Each of N self-shielding triggers 30 is a D flip-flop. The N intermediate command signals CMD_1~CMD_N include a first intermediate command signal that is valid and N−1 second intermediate command signals that are invalid.

A first input end D of each of the N self-shielding triggers 30 is configured to receive the initial command signal CMD, and a second input end C of each of the N self-shielding triggers 30 is connected to an output end of the shielding circuit 201. A first self-shielding trigger among the N self-shielding triggers 30 that receives the first intermediate clock signal is configured to register the initial command signal according to the first intermediate clock signal, and a first output end Q of the first self-shielding trigger is configured to output the first intermediate command signal. Other N−1 second self-shielding triggers among the N self-shielding triggers 30 are configured to receive N−1 second intermediate clock signals at one-to-one correspondence, and first output ends Q of the N−1 second self-shielding triggers are configured to output the N−1 second intermediate command signals at one-to-one correspondence.

In an embodiment of the present disclosure, outputting the first intermediate command signal is triggered by the first intermediate clock signal, and the first intermediate command signal contains a pulse and is a valid signal. Since the action of the N−1 second initial clock signals is shielded, the N−1 second intermediate command signals are not pulse signals that are triggered to be output. Therefore, the N−1 second intermediate command signals contain no pulse and are invalid signals.

In some embodiments of the present disclosure, the shielding circuit includes N AND gates. Each of the N AND gates has N input ends, and includes a first input end and N−1 second input ends. First input end of the N AND gates are configured to receive the N initial clock signals at one-to-one correspondence, and output ends of the N AND gates are connected to second input ends of the N self-shielding flip-flops at one-to-one correspondence. For each of the N AND gates, the N−1 second input ends of the N AND gates are respectively connected to second output ends of N−1 self-shielding triggers other than a self-shielding trigger corresponding to the AND gate.

Figure 5:
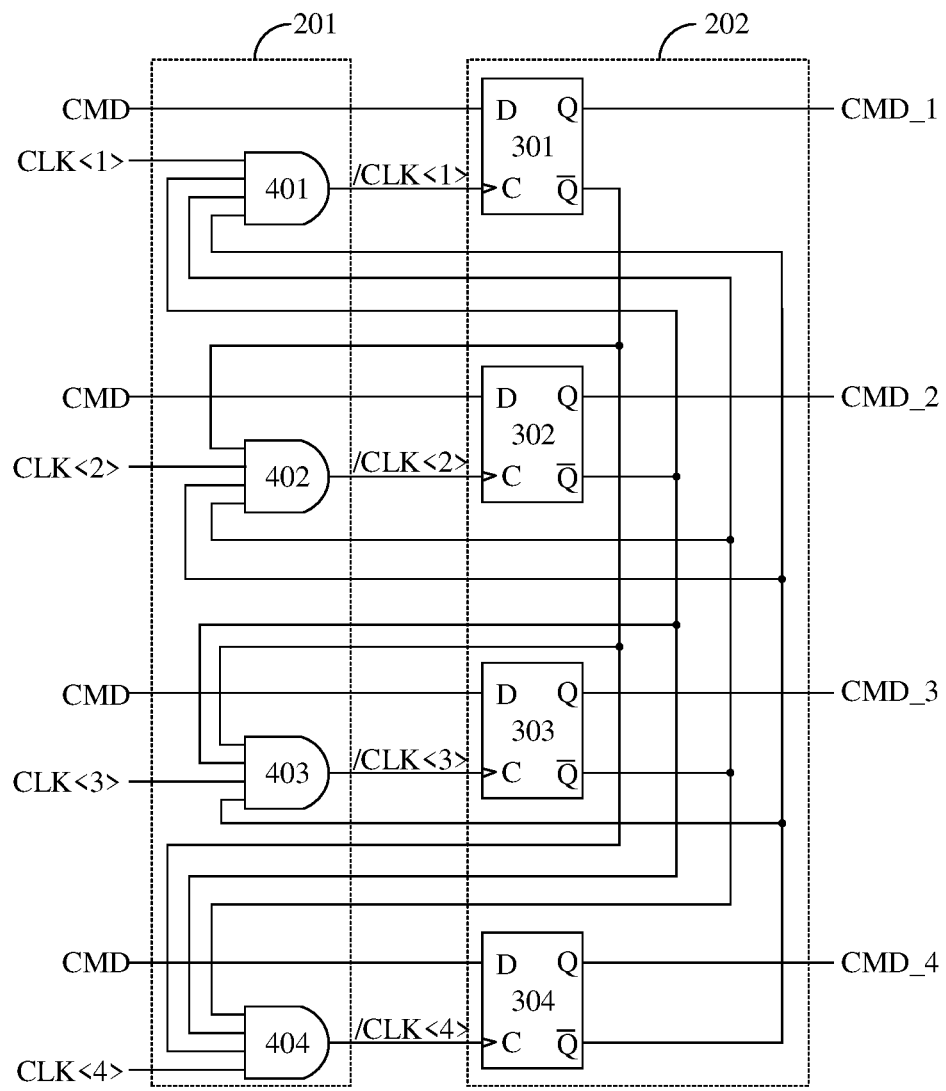
FIG. 5 illustrates a fourth schematic structural diagram of a delay circuit according to embodiments of the present disclosure.

Taking FIG. 5 as an example, the shielding circuit 201 may include four AND gates, namely, an AND gate 401, an AND gate 402, an AND gate 403 and an AND gate 404. Each of the AND gates 401, 402, 403 and 404 is a AND gate with four input ends, and includes a first input end and three second input ends. The first input ends of the four AND gates are configured to receive four initial clock signals at one-to-one correspondence. That is, the first input end of the AND gate 401 is configured to receive the initial clock signal CLK<1>, the first input end of the AND gate 402 is configured to receive the initial clock signal CLK<2>, the first input end of the AND gate 403 is configured to receive the initial clock signal CLK<3>, and the first input end of the AND gate 404 is configured to receive the initial clock signal CLK<4>.

The output ends of the four AND gates are connected to the second input ends C of the four self-shielding triggers at one-to-one correspondence. That is, the output end of the AND gate 401 is connected to the second input end C of the self-shielding trigger 301. The output end of the AND gate 402 is connected to the second input C of the self-shielding trigger 302. The output end of the AND gate 403 is connected to the second input end C of the self-shielding trigger 303. The output end of the AND gate 404 is connected to the second input end C of the self-shielding trigger 304. Here, the output end of the AND gate 401 transmits the intermediate clock signal /CLK<1> to the second input end C of the self-shielding trigger 301. The output end of the AND gate 402 transmits the intermediate clock signal /CLK<2> to the second input end C of the self-shielding trigger 302. The output end of the AND gate 403 transmits the intermediate clock signal /CLK<3> to the second input end C of the self-shielding trigger 303. The output end of the AND gate 404 transmits the intermediate clock signal /CLK<4> to the second input end C of the self-shielding trigger 304.

For each of the four AND gates, three second input ends of the AND gate are respectively connected to the second output ends $\overline{Q}$ of three other self-shielding triggers other than the self-shielding trigger corresponding to the AND gate. That is, the three second input ends of the AND gate 401 are connected to the second output end $\overline{Q}$ of the self-shielding trigger 302, the second output end $\overline{Q}$ of the self-shielding trigger 303, and the second output end $\overline{Q}$ of the self-shielding trigger 304 at one-to-one correspondence. The three second input ends of the AND gate 402 are connected to the second output end $\overline{Q}$ of the self-shielding trigger 301, the second output end $\overline{Q}$ of the self-shielding trigger 303, and the second output end $\overline{Q}$ of the self-shielding trigger 304 at one-to-one correspondence. The three second input ends of the AND gate 403 are connected to the second output end $\overline{Q}$ of the self-shielding trigger 301, the second output end $\overline{Q}$ of the self-shielding trigger 302, and the second output end $\overline{Q}$ of the self-shielding trigger 304 at one-to-one correspondence. The three second input ends of the AND gate 404 are connected to the second output end $\overline{Q}$ of the self-shielding trigger 301, the second output end $\overline{Q}$ of the self-shielding trigger 302, and the second output end $\overline{Q}$ of the self-shielding trigger 303 at one-to-one correspondence.

Figure 6:
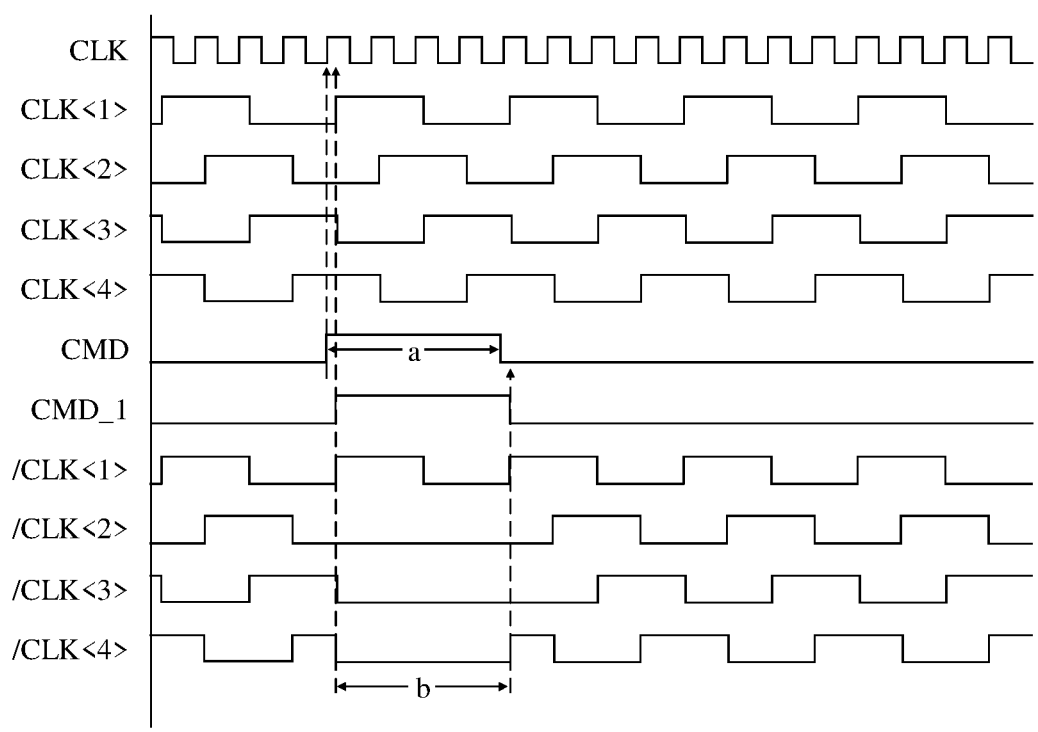
FIG. 6 illustrates a second schematic signal diagram of a delay circuit according to embodiments of the present disclosure.

In embodiments of the present disclosure, combining FIGS. 5 and 6, the initial command signal CMD, the initial clock signals CLK<1>, CLK<2>, CLK<3> and CLK<4> illustrated in FIG. 6 are correspondingly input into the circuit illustrated in FIG. 5.

In a case that the initial command signal CMD is not triggered to be registered, CMD_1, CMD_2, CMD_3, and CMD_4 output from the first output ends Q of the self-shielding triggers 301, 302, 303 and 304 are all at low levels (CMD_2, CMD_3 and CMD_4 are not illustrated in FIG. 6). Then, the three second input ends of each of the AND gates 401, 402, 403, and 404 receive high levels. In this case, the AND gates 401, 402, 403, and 404 do not play a shielding effect. The intermediate clock signal /CLK<1> has the same waveform as the initial clock signal CLK<1>. The intermediate clock signal /CLK<2> has the same waveform as the initial clock signal CLK<2>. The intermediate clock signal /CLK<3> has the same waveform as the initial clock signal CLK<3>. The intermediate clock signal /CLK<4> has the same waveform as the initial clock signal CLK<4>.

In the effective pulse width a of the initial command signal CMD, the initial clock signal CLK<1> arrives the rising edge at earliest, that is, the initial clock signal CLK<1> becomes the first initial clock signal. At the time, the self-shielding trigger 301 is triggered by the intermediate clock signal /CLK<1>, to register the initial command signal CMD, output the first intermediate command signal CMD_1 at the first output end Q of the self-shielding trigger 301, and transmit the inverted signal of the first intermediate command signal CMD_1 to the AND gates 402, 403 and 404. That is, the intermediate clock signal /CLK<1> becomes the first intermediate clock signal that is valid. Since the inverted signal of the first intermediate command signal CMD_1 contains a low-level pulse, the intermediate clock signals /CLK<2>, /CLK<3> and /CLK<4> output by the AND gates 402, 403 and 404 remain at the low levels during a duration b of the low-level pulse. That is, in the duration b of the low-level pulse, the intermediate clock signals /CLK<2>, /CLK<3> and /CLK<4> are all shielded, i.e. the intermediate clock signals /CLK<2>, /CLK<3> and /CLK<4> are all invalid second intermediate clock signals. Furthermore, in the effective pulse width a of the initial command signal CMD, the intermediate clock signals /CLK<2>, /CLK<3> and /CLK<4> do not produce a rising edge to trigger the self-shielding triggers 302, 303 and 304 to register the initial command signal CMD. The CMD2, CMD_3 and CMD_4 output from the first output ends Q of the self-shielding triggers 302, 303 and 304 remain at the low levels without containing any pulse (not shown in FIG. 6).

It is understood that the first initial clock signal triggers registering of the initial command signal, to obtain a shifted command signal. Furthermore, the N−1 AND gates that do not receive the first initial clock signal shield the second initial clock signals according to the shifted command signal. Thereby, the error caused by the simultaneous action of the N initial clock signals can be avoided, and the accuracy of signal processing can be improved.

In some embodiments of the present disclosure, the shielding circuit includes N inverters and N NOR gates, and each of the N NOR gates has N input ends and includes a first input end and N−1 second input ends. Input ends of the N inverters are configured to receive the N initial clock signals at one-to-one correspondence, output ends of the N inverters are connected to first input ends of the N NOR gates at one-to-one correspondence, and output ends of the N NOR gates are connected to the second input ends of the N self-shielding triggers at one-to-one correspondence. For each of the N NOR gates, the N−1 second input ends of the N NOR gate are connected to first output ends of N−1 self-shielding triggers other than the self-shielding triggers corresponding to the NOR gate.

Figure 7:
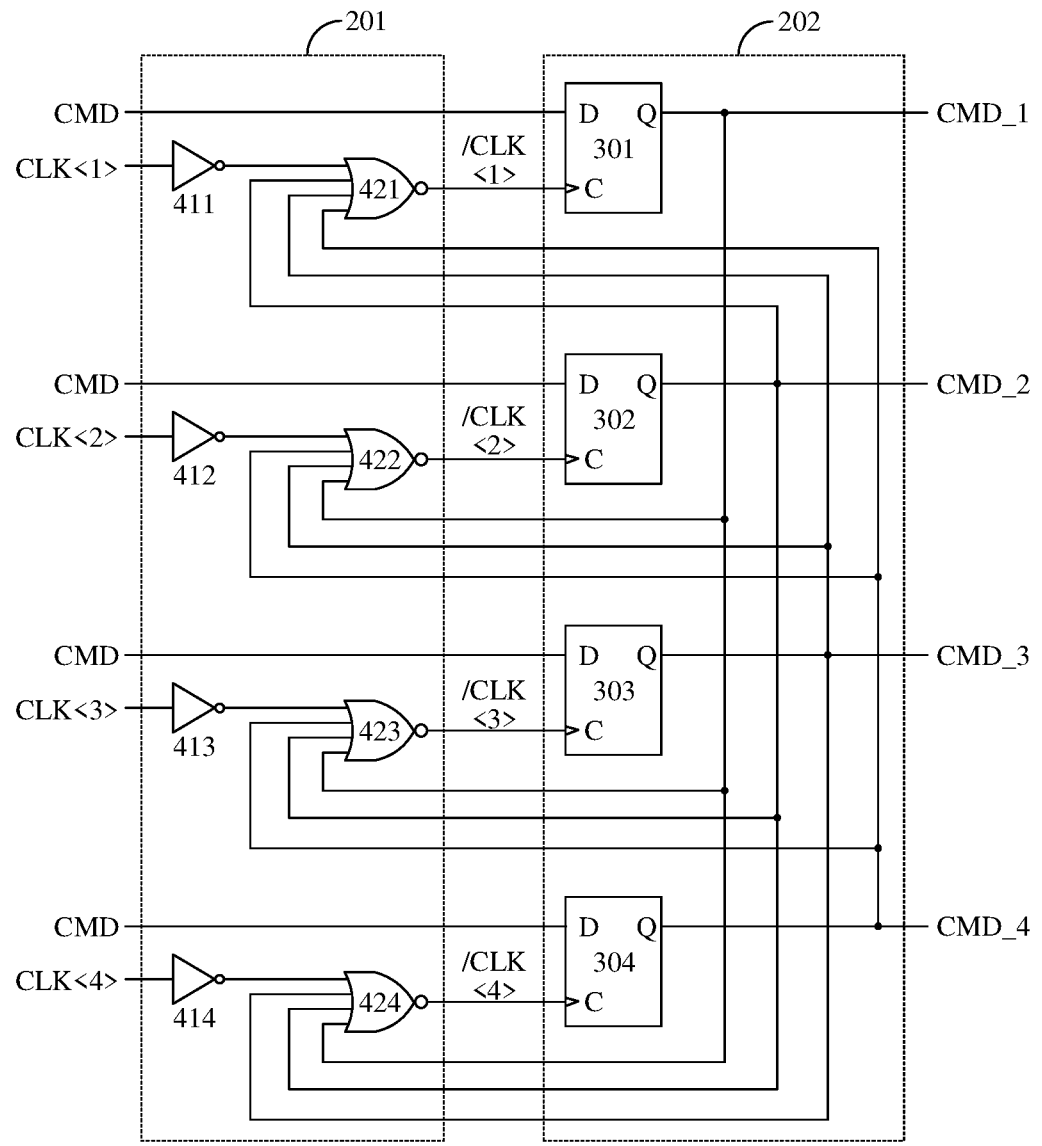
FIG. 7 illustrates a fifth schematic structural diagram of a delay circuit according to embodiments of the present disclosure.

Taking FIG. 7 as an example, the shielding circuit 201 may include four inverters, i.e., an inverter 411, an inverter 412, an inverter 413, an inverter 414, and four NOR gates, i.e., a NOR gate 421, a NOR gate 422, a NOR gate 423, and a NOR gate 424. Each of the four NOR gates includes four input ends, and includes a first input end and three second input ends. The input ends of the four inverters receive four initial clock signals at one-to-one correspondence. That is, the input end of the inverter 411 receives the initial clock signal CLK<1>, the input end of the inverter 412 receives the initial clock signal CLK<2>, the input end of the inverter 413 receives the initial clock signal CLK<3>, and the input end of the inverter 414 receives the initial clock signal CLK<4>.

The output ends of the four inverters are connected to the first input ends of the four NOR gates at one-to-one correspondence. That is, the output end of the inverter 411 is connected to the first input end of the NOR gate 421. The output end of the inverter 412 is connected to the first input end of the NOR gate 422. The output end of the inverter 413 is connected to the first input end of the NOR gate 423. The output end of the inverter 414 is connected to the first input end of the NOR gate 424.

The output ends of the four NOR gates are connected to the second input ends C of the four self-shielding triggers at one-to-one correspondence. That is, the output end of the NOR gate 421 is connected to the second input end C of the self-shielding trigger 301. The output end of NOR gate 422 is connected to the second input C of the self-shielding trigger 302. The output end of the NOR gate 423 is connected to the second input end C of the self-shielding trigger 303. The output end of NOR gate 424 is connected to a second input end C of the self-shielding trigger 304. The output end of the NOR gate 421 transmits the intermediate clock signal /CLK<1> to the second input end C of the self-shielding trigger 301. The output end of the NOR gate 422 transmits the intermediate clock signal /CLK<2> to the second input end C of the self-shielding trigger 302. The output end of the NOR gate 423 transmits the intermediate clock signal /CLK<3> to the second input end C of the self-shielding trigger 303. The output end of the NOR gate 424 transmits the intermediate clock signal /CLK<4> to the second input end C of the self-shielding trigger 304.

For each of the four NOR gates, the three second input ends of the four NOR gate are respectively connected to the first output ends Q of the three self-shielding triggers other than the self-shielding trigger corresponding to the NOR gate. That is, the three second input ends of the NOR gate 421 are connected to the first output end Q of the self-shielding trigger 302, the first output end Q of the self-shielding trigger 303, and the first output end Q of the self-shielding trigger 304 at one-to-one correspondence. The three second input ends of the NOR gate 422 are connected to the first output end Q of the self-shielding trigger 301, the first output end Q of the self-shielding trigger 303, and the first output end Q of the self-shielding trigger 304 at one-to-one correspondence. The three second input ends of the NOR gate 423 are connected to the first output end Q of the self-shielding trigger 301, the first output end Q of the self-shielding trigger 302, and the first output end Q of the self-shielding trigger 304 at one-to-one correspondence. The three second input ends of NOR gate 424 are connected to the first output end Q of the self-shielding trigger 301, the first output end Q of the self-shielding trigger 302, and the first output end Q of the self-shielding trigger 303 at one-to-one correspondence.

In an embodiment of the present disclosure, combining FIGS. 6 and 7, the initial command signal CMD, and the initial clock signals CLK<1>, CLK<2>, CLK<3> and CLK<4> illustrated in FIG. 6 are correspondingly input into the circuit illustrated in FIG. 7.

In a case that the initial command signal CMD is not triggered to be registered, CMD_1, CMD_2, CMD_3, and CMD_4 output from the first output ends Q of the self-shielding triggers 301, 302, 303 and 304 are all at the low levels (CMD_2, CMD_3 and CMD_4 are not shown in FIG. 6). Then, the three second input ends of each of the NOR gates 421, 422, 423, and 424 receive the low levels. In this case, the NOR gates 421, 422, 423 and 424 do not produce a shielding effect. The intermediate clock signal /CLK<1> has the same waveform as the initial clock signal CLK<1>. The intermediate clock signal /CLK<2> has the same waveform as the initial clock signal CLK<2>. The intermediate clock signal /CLK<3> has the same waveform as the initial clock signal CLK<3>. The intermediate clock signal /CLK<4> has the same waveform as the initial clock signal CLK<4>.

In the effective pulse width a of the initial command signal CMD, the initial clock signal CLK<1> reaches the rising edge at earliest, that is, the initial clock signal CLK<1> becomes the first initial clock signal. At the time, the self-shielding trigger 301 is triggered by the intermediate clock signal /CLK<1>, to register the initial command signal CMD, output the first intermediate command signal CMD_1 at the first output end Q of the self-shielding trigger 301, and transmit the first intermediate command signal CMD_1 to the NOR gates 422, 423 and 424 at the same time. That is, the intermediate clock signal /CLK<1> becomes a first intermediate clock signal that is valid. Since the first intermediate command signal CMD_1 includes a high-level pulse, the intermediate clock signals /CLK<2>, /CLK<3> and /CLK<4> output by the NOR gates 422, 423 and 424 remain at the low level during a duration b of the high-level pulse. That is, during the duration b of the high-level pulse, the intermediate clock signals /CLK<2>, /CLK<3> and /CLK<4> are shielded, i.e., the intermediate clock signals /CLK<2>, /CLK<3> and /CLK<4> are all invalid second intermediate clock signals. Further, in the effective pulse width a of the initial command signal CMD, the intermediate clock signals /CLK<2>, /CLK<3> and /CLK<4> do not produce a rising edge to trigger the self-shielding triggers 302, 303 and 304 to register the initial command signal CMD. The CMD2, CMD_3 and CMD_4 output from the first output ends Q of the self-shielding triggers 302, 303 and 304 remain at the low levels without containing any pulse (not shown in FIG. 6).

It is understood that the first initial clock signal triggers registering of the initial command signal, to obtain a shifted command signal. Furthermore, the N−1 NOR gates that do not receive the first initial clock signal through the inverters shield the second initial clock signals according to the shifted command signal. Thereby, the error caused by the simultaneous action of the N initial clock signals can be avoided, and the accuracy of signal processing can be improved.

Figure 8:
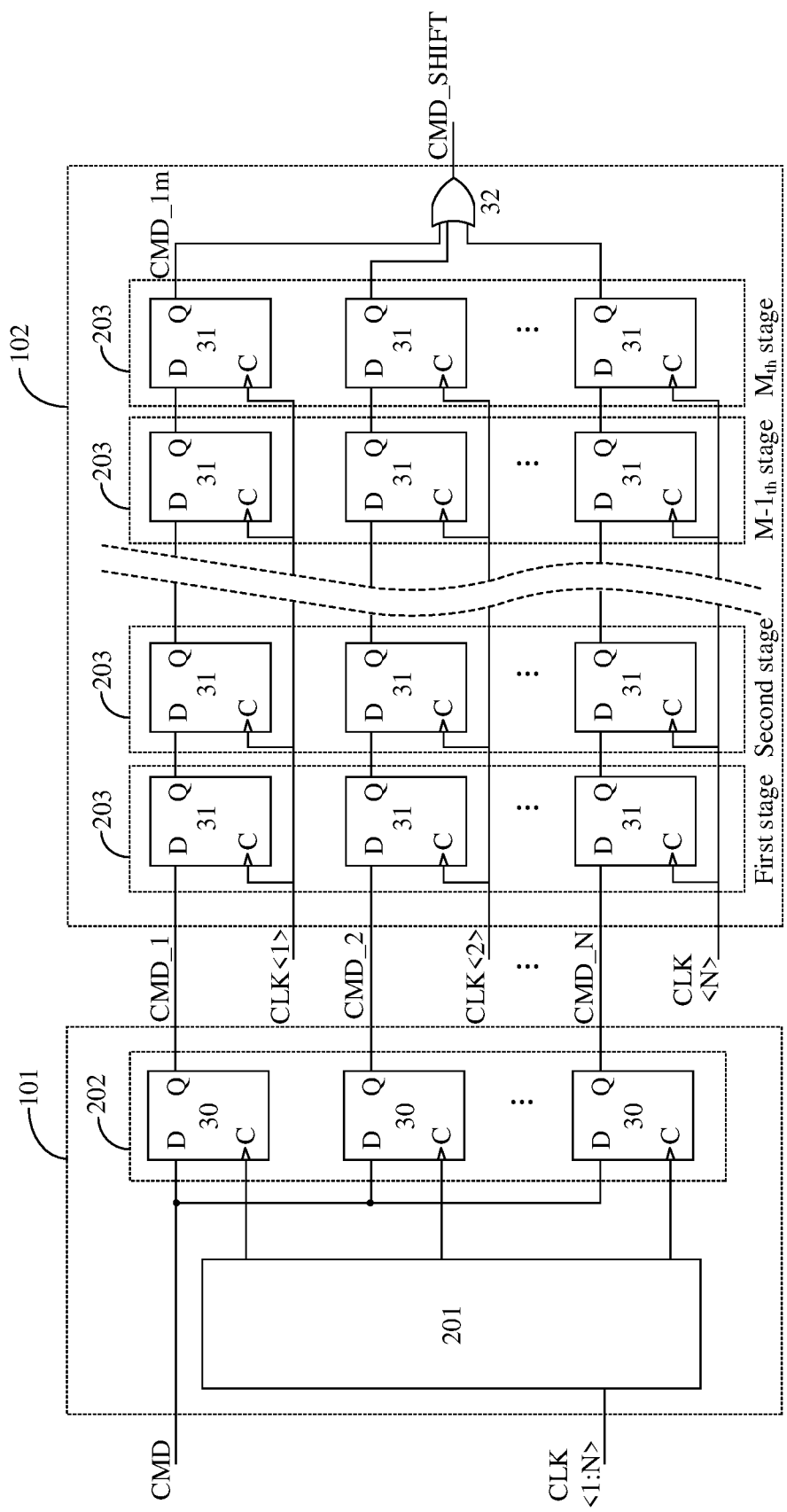
FIG. 8 illustrates a sixth schematic structural diagram of a delay circuit according to embodiments of the present disclosure.

In some embodiments of the present disclosure, as illustrated in FIG. 8, the delay 102 includes M stages of second registers, where M is an integer greater than or equal to 2. Each of the M stages of second registers 203 includes N delay triggers 31, and each of N delay triggers 31 is a D flip-flop. First input ends D of N delay triggers 31 in a first stage of second register 203 are connected to first output ends Q of the N self-shielding triggers 30 at one-to-one correspondence. Second input ends C of the N delay triggers 31 in each of the M stages of the second registering circuit 203 are configured to receive the N initial clock signals CLK<1>, CLK<2> . . . CLK<N> (i.e. CLK<1:N>) at one-to-one correspondence.

In embodiments of the present disclosure, when M is greater than or equal to 2, the first input ends D of the N delay triggers 31 in an $i_{th}$ stage of second register 203 are respectively connected to the first output ends Q of the N delay triggers 31 in a stage of second register 203 immediately previous to the $i_{th}$ stage of second register, and i is greater than 1 and less than or equal to M. As illustrated in FIG. 8, the first input ends D of the N delay triggers 31 in a second stage of second register 203 are respectively connected to the first output ends Q of the N delay triggers 31 in the first stage of second register 203. The first input ends D of the N delay triggers 31 in the $M_{th}$ stage of second register 203 are respectively connected to the first output ends Q of the N delay triggers 31 in an $M-1_{th}$ stage of second register 203.

In an embodiment of the present disclosure, of the number of stages of second register circuits 203 is M=(CL−A)/N, where CL is a maximum number of delay periods, and A is a number of periods corresponding to a command pre-operation. Both CL and A satisfy the requirements of integrated circuit design standards.

Here, the clock period corresponding to CL and A may be a period of an external clock, i.e. $1/N_{th}$ of the period of the initial clock signal. The command pre-operation includes a pre-write operation and a pre-read operation, so that A=a1+a2. When the initial command signal is "read command", a1 corresponds to a clock period of a preamble (prefetch), and a2 corresponds to a clock period of an offset (i.e., a deviation margin of the clock signal).

In embodiments of the present disclosure, as illustrated in FIG. 8, the delay 102 further includes an OR gate 32, and the OR gate 32 includes N input ends. First output ends Q of the N delay triggers 31 in an $M_{th}$ stage of second register 203 are connected to the N input ends of the OR gate 32 at one-to-one correspondence. An output end of the OR gate 32 serves as an output end of the delay 102 and outputs the delayed command signal CMD_SHIFT.

Figure 9:
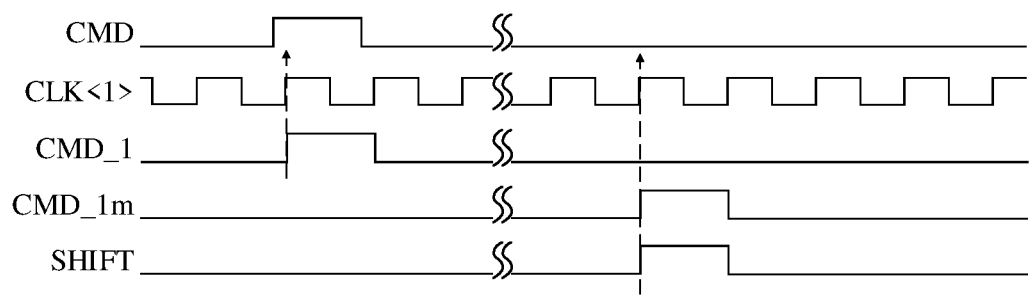
FIG. 9 illustrates a third schematic signal diagram of a delay circuit according to embodiments of the present disclosure.

In embodiments of the present disclosure, combining FIGS. 8 and 9, when the initial clock signal CLK<1> becomes the first initial clock signal, the initial command signal CMD is registered as the first intermediate command signal CMD_1. After passing through the M stages of second registers 203, the first intermediate command signal CMD_1 is delayed to be the signal CMD_1m and input into the OR gate 32. The waveforms of the initial command signal CMD, the first intermediate command signal CMD_1 and the signal CMD_1m are illustrated in FIG. 9. At the same time, the second intermediate command signals CMD_2 to CMD_N remain at the low levels without any pulse. As such, after passing through the M stages of second registers 203, the first output ends Q of the delay triggers 31 in the $M_{th}$ stage of second register 203 corresponding to the second intermediate command signals CMD_2 to CMD_N still output low levels without any pulse. Thus, the signal CMD_1m is received by one input end of the OR gate 32, and continuous low levels are received by the second input ends of the OR gate 32. Therefore, the delayed command signal CMD_SHIFT output by the OR gate 32 has the same waveform as the signal CMD_1m, and the effective pulse width of the delayed command signal CMD_SHIFT is equal to the effective pulse width of the initial command signal CMD.

It is understood that the self-shielding circuit shields the action of the second initial clock signals, and only outputs a single shifted command signal. Furthermore, the delay can delay the single shifted command signal. Thereby, it is ensured that the effective pulse width of the delayed command signal finally obtained is equal to that of the initial command signal, and the accuracy of signal processing can be improved.

Figure 10:
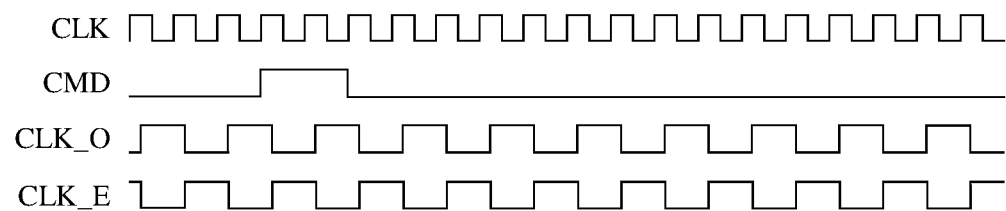
FIG. 10 illustrates a fourth schematic signal diagram of a delay circuit according to embodiments of the present disclosure.

In some embodiments of the present disclosure, N=2, the N initial clock signals are odd-even frequency division clock signals. As illustrated in FIG. 10, the odd-even frequency division clock signals include an odd clock signal CLK_O and an even clock signal CLK_E. The odd clock signal CLK_O has the same frequency as the even clock signal CLK_E and has a phase different from a phase of the even clock signal CLK_E. The odd clock signal CLK_O and the even clock signal CLK_E are the frequency two-division signals of the clock signal CLK, have a period twice the period of the clock signal CLK, and have a frequency that is one-half of the frequency of the clock signal CLK.

Figure 11:
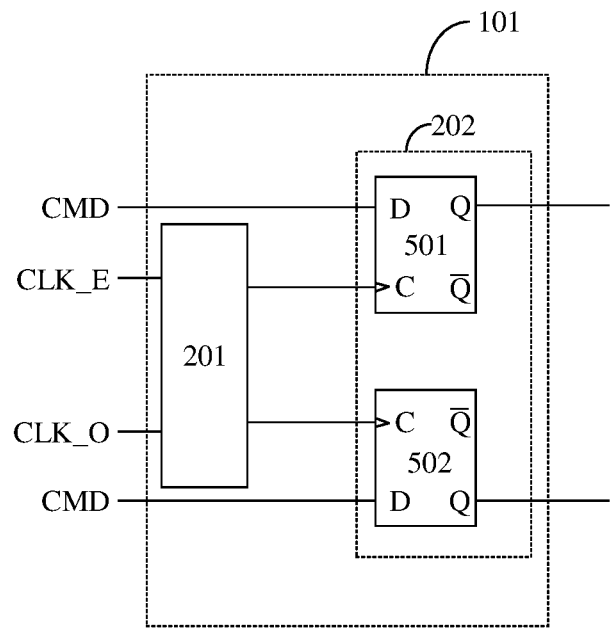
FIG. 11 illustrates a seventh schematic structural diagram of a delay circuit according to embodiments of the present disclosure.

In some embodiments of the present disclosure, as illustrated in FIG. 11, the self-shielding circuit 101 includes a shielding circuit 201 and a register 202. The register 202 includes a first self-shielding trigger 501 and a second self-shielding trigger 502. In conjunction with FIGS. 10 and 11, each of the first self-shielding trigger 501 and the second self-shielding trigger 502 is a D flip-flop, and a first input end D of the first self-shielding trigger 501 and a first input end D of the second self-shielding trigger 502 are configured to receive the initial command signal CMD. The shielding circuit 201 receives the odd clock signal CLK_O and the even clock signal CLK_E, respectively, and the shielding circuit 201 is connected to the second input end C of the first self-shielding trigger 501 and the second input end C of the second self-shielding trigger 502, respectively.

Figure 12:
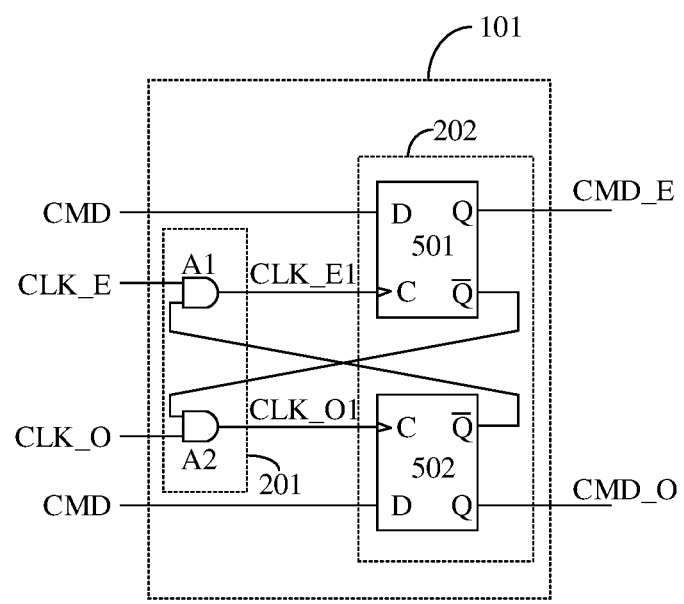
FIG. 12 illustrates an eighth schematic structural diagram of a delay circuit according to embodiments of the present disclosure.

In some embodiments of the present disclosure, as illustrated in FIG. 12, the shielding circuit 101 includes a first AND gate A1 and a second AND gate A2, and each of the first AND gate A1 and the second AND gate A2 has two input ends. A first input end of the first AND gate A1 is configured to receive the even clock signal CLK_E, an output end of the first AND gate A1 is connected to a second input end C of the first self-shielding trigger 501, and a second input end of the first AND gate A1 is connected to a second output end $\overline{Q}$ of the second self-shielding trigger 502. The first AND gate A1 outputs an intermediate clock signal CLK_E1. A first input end of the second AND gate A2 receives the odd clock signal CLK_O, an output end of the second AND gate A2 is connected to a second input end C of the second self-shielding trigger 502, and a second input end of the second AND gate A2 is connected to a second output end $\overline{Q}$ of the first self-shielding trigger 501. The second AND gate A2 outputs an intermediate clock signal CLK_O1.

Figure 13:
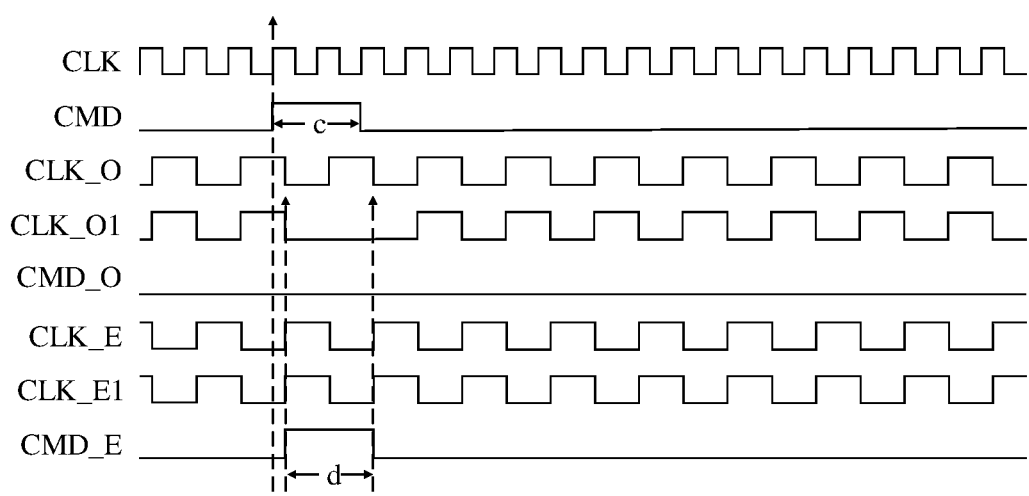
FIG. 13 illustrates a fifth schematic signal diagram of a delay circuit according to embodiments of the present disclosure.

Combining FIGS. 12 and 13, in a case that the initial command signal CMD is not triggered to be registered, and the CMD_E output from the first output end Q of the first self-shielding trigger 501 and the CMD_O output from the first output end Q of the second self-shielding trigger 502 are both at the low levels, the second input end of the second AND gate A2 and the second input end of the first AND gate A1 both receive high levels. In this case, the first AND gate A1 and the second AND gate A2 do not produce a shielding effect, the intermediate clock signal CLK_E1 has the same waveform as the even clock signal CLK_E, and the intermediate clock signal CLK_O1 has the same waveform as the odd clock signal CLK_O.

In the effective pulse width c of the initial command signal CMD, the rising edge of the even clock signal CLK_E arrives earlier than the odd clock signal CLK_O (as indicated by the dashed arrow in FIG. 13), i.e. the even clock signal CLK_E becomes the first initial clock signal. At the time, the first self-shielding trigger 501 is triggered by the intermediate clock signal CLK_E1, to register the initial command signal CMD, output the shifted command signal CMD_E at the first output end Q of the first self-shielding trigger 501, and output the inverted signal of the shifted command signal CMD_E to the second input end of the second AND gate A2. Since the inverted signal of the shifted command signal CMD_E includes a low-level pulse, the intermediate clock signal CLK_O1 output by the second AND gate A2 remains at a low level in a duration d of the low-level pulse. That is, in the duration d of the low-level pulse, the odd clock signal CLK_O is shielded by the second AND gate A2. Furthermore, the intermediate clock signal CLK_O1 does not generate a rising edge to trigger the second self-shielding trigger 502 to register the initial command signal CMD. The CMD_O output from the first output end Q of the second self-shielding trigger 502 remains at a low level without containing any pulse.

Accordingly, when the odd clock signal CLK_O becomes the first initial clock signal, the second self-shielding trigger 502 is triggered by the intermediate clock signal CLK_O1 to register the initial command signal CMD, while the CMD_E output from the first output end Q of the first self-shielding trigger 501 remains at the low level without containing any pulse.

Figure 14:
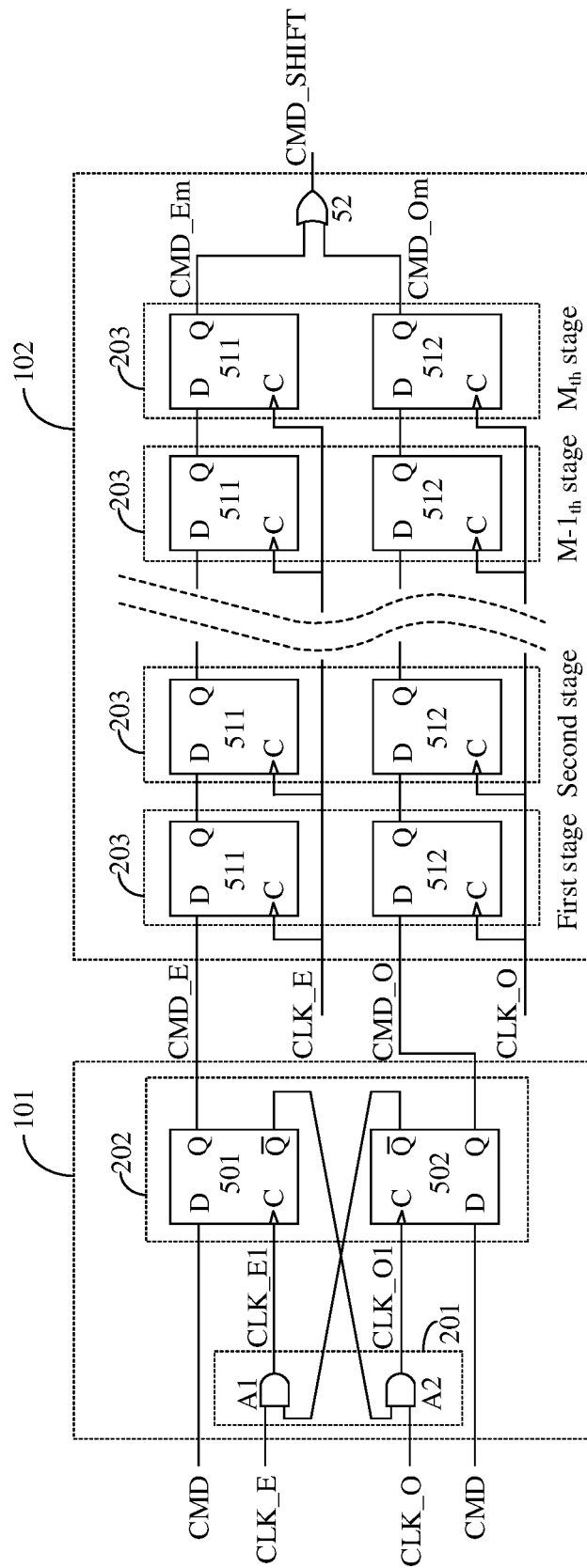
FIG. 14 illustrates a ninth schematic structural diagram of a delay circuit according to embodiments of the present disclosure.

In embodiments of the present disclosure, as illustrated in FIG. 14, the delay 102 may include M stages of second registers 203, where M is an integer greater than or equal to 2. Each stage of second register 203 includes delay triggers 511 and 512, and each of the delay triggers 511 and 512 is a D flip-flop. In a first stage of second register 203, a first input end D of the delay trigger 511 is connected to a first output end Q of the self-shielding trigger 501, and a first input end D of the delay trigger 512 is connected to a first output end Q of the self-shielding trigger 502. In each stage of second register 203, the second input end C of the delay trigger 511 receives the even clock signal CLK_E, and the second input end C of the delay trigger 512 receives the odd clock signal CLK_O. Here, when M is greater than or equal to 2, the first input end D of the delay trigger 511 in a $i_{th}$ stage of second register 203 is connected to a first output end Q of the delay trigger 511 in an immediately previous stage of second register 203, and the first input end D of the delay trigger 512 in the $i_{th}$ stage of second register 203 is connected to the first output end Q of the delay trigger 512 in the immediately previous stage of second register 203. Here, i is greater than 1 and less than or equal to M.

As illustrated in FIG. 14, the delay 102 further includes an OR gate 52, and the OR gate 52 includes two input ends. The first output ends Q of the delay triggers 511 and 512 in an $M_{th}$ stage of second register 203 are connected to the two input ends of the OR gate 52 at one-to-one correspondence. An output end of the OR gate 52 serves as an output end of the delay 102 and outputs the delayed command signal CMD_SHIFT.

Figure 15:
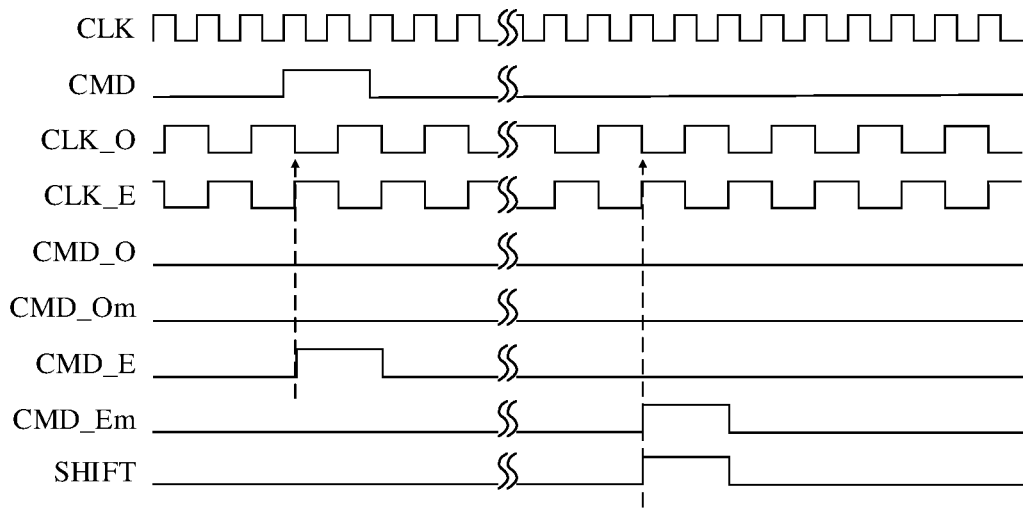
FIG. 15 illustrates a sixth schematic signal diagram of a delay circuit according to embodiments of the present disclosure.

In embodiments of the present disclosure, combining FIGS. 14 and 15, when the even clock signal CLK_E becomes the first initial clock signal, the initial command signal CMD is registered as a shifted command signal CMD_E. Thus, the shifted command signal CMD_E is delayed to be a signal CMD_Em after passing through the M stages of second registers 203, and the signal CMD_Em is input into the OR gate 52. The waveforms of the initial command signal CMD, the shifted command signal CMD_E and the signal CMD_Em are illustrated in FIG. 15. At the same time, the signal CMD_O output from the self-shielding trigger 502 remains at the low level without any pulse. As such, after passing through the M stages of second registers 203, the signal CMD_Om output from the delay trigger 512 in the M stages of second registers 203 remains at the low level without any pulse. Thus, one input end of the OR gate 52 receives the signal CMD_Em and the other input end receives a continuous low level. Therefore, the delayed command signal CMD_SHIFT output by the OR gate 52 has the same waveform as the signal CMD_Em, and the effective pulse width of the delayed command signal CMD_SHIFT is equal to the effective pulse width of the initial command signal CMD.

It is understood that the first initial clock signal triggers registering of the initial command signal, to obtain a shifted command signal. The AND gate that does not receive the first initial clock signal shield the other frequency-division clock signal according to the shifted command signal, so that the self-shielding circuit only outputs a single shifted command signal. Furthermore, the delay can delay the single shifted command signal; thereby, avoiding the error caused by the simultaneous action of the odd clock signal and the even clock signal, ensuring that the effective pulse width of the delayed command signal finally obtained is equal to that of the initial command signal, and improving the accuracy of signal processing.

Figure 16:
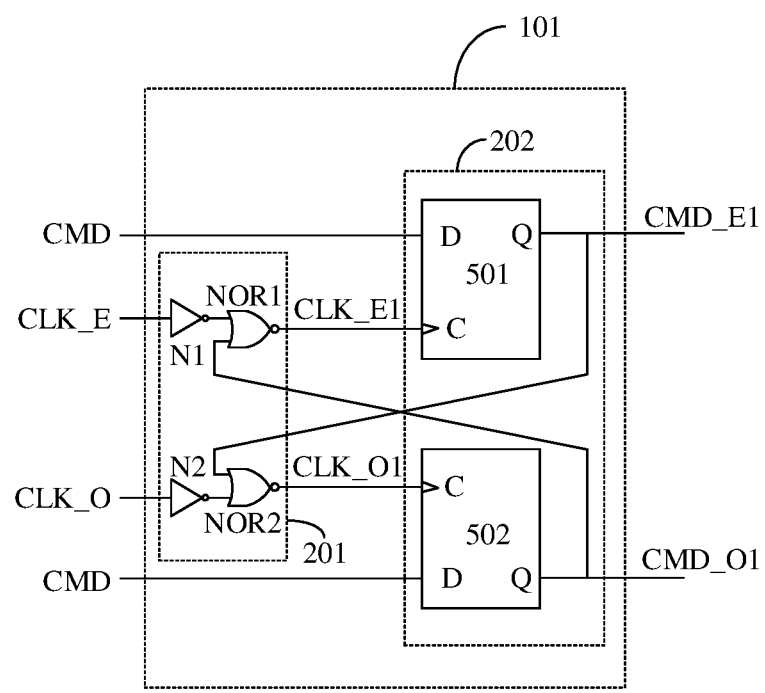
FIG. 16 illustrates a tenth schematic structural diagram of a delay circuit according to embodiments of the present disclosure.

In some embodiments of the present disclosure, as illustrated in FIG. 16, the shielding circuit 101 includes a first inverter N1, a second inverter N2, a first NOR gate NOR1 and a second NOR gate NOR2. Each of the first NOR gate NOR1 and the second NOR gate NOR2 includes two input ends. An input end of the first inverter N1 receives the even clock signal CLK_E, and an output end of the first inverter N1 is connected to a first input end of the first NOR gate NOR1. An output end of the first NOR gate NOR1 is connected to a second input end C of the first self-shielding trigger 501, and a second input end of the first NOR gate NOR1 is connected to a first output end Q of the second self-shielding trigger 502. An input end of the second inverter N2 receives the odd clock signal CLK_O, and an output end of the second inverter N2 is connected to a first input end of the second NOR gate NOR2. An output end of the second NOR gate NOR2 is connected to a second input end C of the second self-shielding trigger 502, and a second input end of the second NOR gate NOR2 is connected to a first output end Q of the first self-shielding trigger 501.

Combining FIGS. 16 and 13, in a case that the initial command signal CMD is not triggered to be registered, the CMD_E output from the first output end Q of the first self-shielding trigger 501 and the CMD_O output from the first output end Q of the second self-shielding trigger 502 are both at low levels. That is, the second input end of the second NOR gate NOR2 and the second input end of the first NOR gate NOR1 both receive the low levels. In this case, the first NOR gate NOR1 and the second NOR gate NOR2 do not produce the shielding effect, the first intermediate clock signal CLK_E1 has the same waveform as the even clock signal CLK_E, and the second intermediate clock signal CLK_O1 has the same waveform as the odd clock signal CLK_O.

In the effective pulse width c of the initial command signal CMD, the rising edge of the even clock signal CLK_E arrives earlier than the odd clock signal CLK_O (as indicated by the dashed arrow in FIG. 13), i.e. the even clock signal CLK_E becomes the first initial clock signal. At the time, the first self-shielding trigger 501 is triggered by the first intermediate clock signal CLK_E1, to register the initial command signal CMD, and output, at the first output end Q of the first self-shielding trigger 501, the shifted command signal CMD_E to the second input end of the second NOR gate NOR2. Since the shifted command signal CMD_E includes a high-level pulse, the second intermediate clock signal CLK_O1 output by the second NOR gate NOR2 remains at the low level in a duration d of the high-level pulse. That is, in the duration d of the high-level pulse, the odd clock signal CLK_O is shielded. Furthermore, the second intermediate clock signal CLK_O1 does not produce a rising edge to trigger the second self-shielding trigger 502 to register the initial command signal CMD. The CMD_O output from the first output end Q of the second self-shielding trigger 502 remains at the low level without containing any pulse.

Accordingly, when the odd clock signal CLK_O becomes the first initial clock signal, the second self-shielding trigger 502 is triggered by the second intermediate clock signal CLK_O1 to register the initial command signal CMD, while the CMD_E output from the first output end Q of the first self-shielding trigger 501 remains at the low level without containing any pulse.

Figure 17:
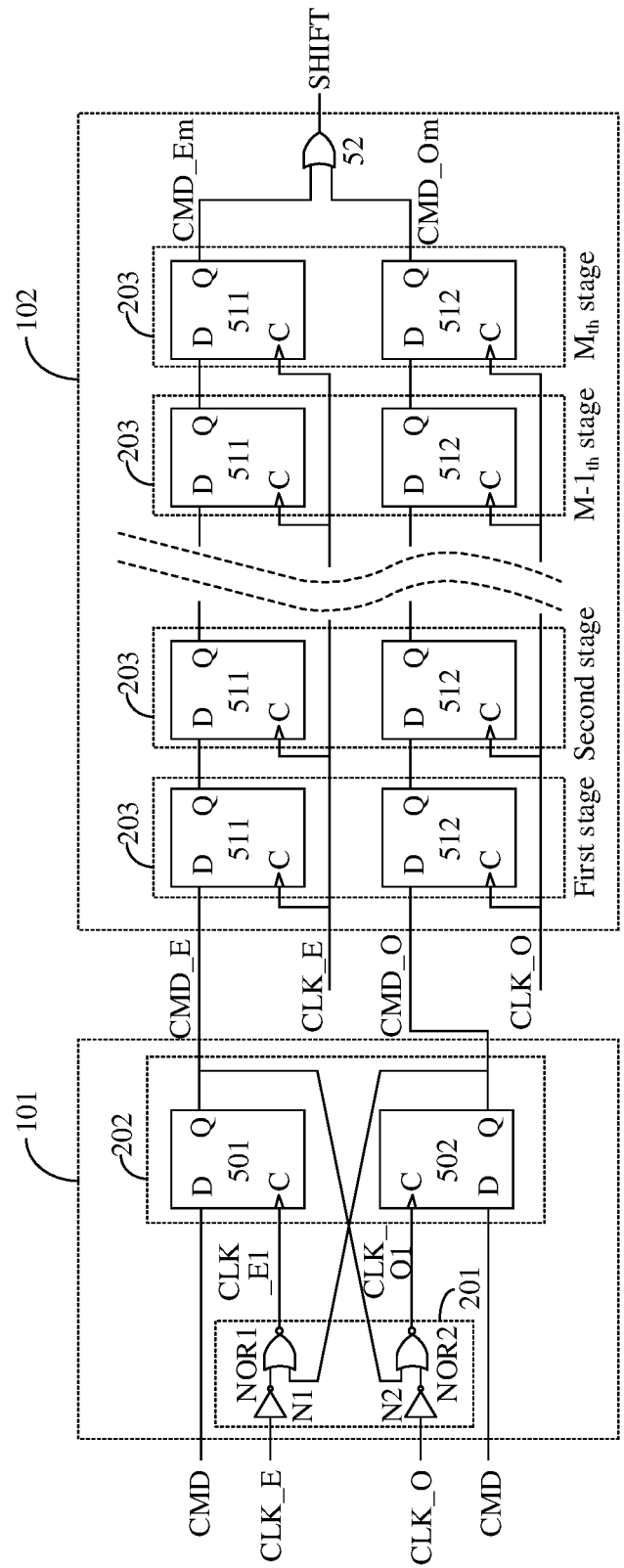
FIG. 17 illustrates an eleventh schematic structural diagram of a delay circuit according to embodiments of the present disclosure.

In embodiments of the present disclosure, as illustrated in FIG. 17, the delay 102 may include M stages of second registers 203, where M is an integer greater than or equal to 2. Each stage of second registers 203 includes delay triggers 511 and 512, and each of the delay triggers 511 and 512 is a D flip-flop. In the first stage of second registers 203, the first input end D of the delay trigger 511 is connected to the first output end Q of the self-shielding trigger 501, and the first input end D of the delay trigger 512 is connected to the first output end Q of the self-shielding trigger 502. In each stage of second registers 203, the second input end C of the delay trigger 511 receives the even clock signal CLK_E, and the second input end C of the delay trigger 512 receives the odd clock signal CLK_O. Here, when M is greater than or equal to 2, the first input end D of the delay trigger 511 in the $i_{th}$ stage of second register 203 is connected to the first output end Q of the delay trigger 511 in the immediately previous stage of second register 203, and the first input end D of the delay trigger 512 in the $i_{th}$ stage of second register 203 is connected to the first output end Q of the delay trigger 512 in the immediately previous stage of second register 203. Here, i is greater than 1 and less than or equal to M.

As illustrated in FIG. 17, the delay 102 further includes an OR gate 52, and the OR gate 52 includes two input ends. The first output ends Q of the delay triggers 511 and 512 in the $M_{th}$ stage of second register 203 are connected to the two input ends of the OR gate 52 at one-to-one correspondence. An output end of the OR gate 52 serves as an output end of the delay 102 and outputs the delayed command signal CMD_SHIFT.

In embodiments of the present disclosure, combining FIGS. 17 and 15, when the even clock signal CLK_E becomes the first initial clock signal, the initial command signal CMD is registered to be the shifted command signal CMD_E. Thereby, the shifted command signal CMD_E is delayed to be the signal CMD_Em after passing through the M stages of second registers 203, and the signal CMD_Em is input into the OR gate 52. The waveforms of the initial command signal CMD, the shifted command signal CMD_E and the signal CMD_Em are illustrated in FIG. 15.

At the same time, the signal CMD_O output from the self-shielding trigger 502 remains at the low level without any pulse. As such, after passing through the M stages of second registers 203, the signal CMD_Om output from the delay trigger 512 in the M stages of second registers 203 still remains at the low level without any pulse.

Thus, one input end of the OR gate 52 receives the signal CMD_Em and the other input end receives the continuous low level. Therefore, the delayed command signal CMD_SHIFT output by the OR gate 52 has the same waveform as the signal CMD_Em, and the effective pulse width of the delayed command signal CMD_SHIFT is equal to the effective pulse width of the initial command signal CMD.

It is understood that the first initial clock signal triggers registering of the initial command signal, to obtain the shifted command signal. The NOR gate that does not receive the first initial clock signal through the inverter, shields the other frequency-division clock signal according to the shifted command signal, so that the self-shielding circuit only outputs the single shifted command signal. Furthermore, the delay can delay the single shifted command signal; thereby, avoiding the error caused by the simultaneous action of the odd clock signal and the even clock signal, ensuring that the effective pulse width of the delayed command signal finally obtained is equal to that of the initial command signal, and improving the accuracy of signal processing.

In some embodiments of the present disclosure, the initial command signal is valid at the high level, and the effective pulse width of the initial command signal is greater than or equal to the period length of each of the initial clock signals. The initial command signal is a read command in the memory.

In the embodiments of the present disclosure, the initial command signal is at the low level in the normal state, and the initial command signal produces a control action when containing a high level pulse.

The effective pulse width of the initial command signal is greater than or equal to the period length of each of the initial clock signals, so that in the effective pulse width of the initial command signal, a triggering edge can be reached at least once for each of the initial clock signals. Thereby, it can be ensured that the initial command signal can always be registered and delayed by the delay circuit according to the embodiments of the present disclosure. The initial command signal may be a read command in the memory, i.e. the initial command signal may be used to control the reading of data in the memory.

Figure 18:
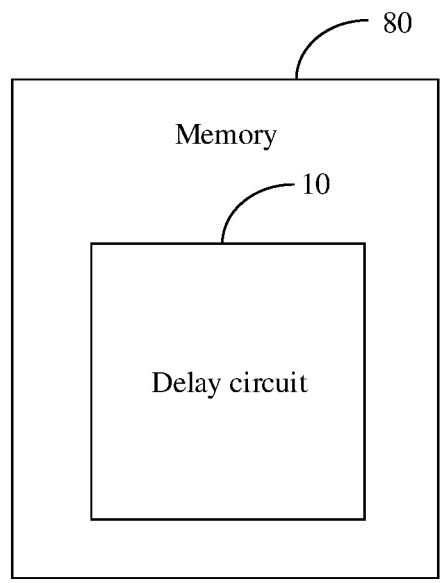
FIG. 18 illustrates a first schematic structural diagram of a memory according to embodiments of the present disclosure.

Embodiments of the present disclosure also provide a memory 80. As illustrated in FIG. 18, the memory 80 includes the delay circuit 10 according to the previous embodiments. The memory 80 illustrated in FIG. 18 may be a dynamic random access memory (DRAM).

Figure 19:
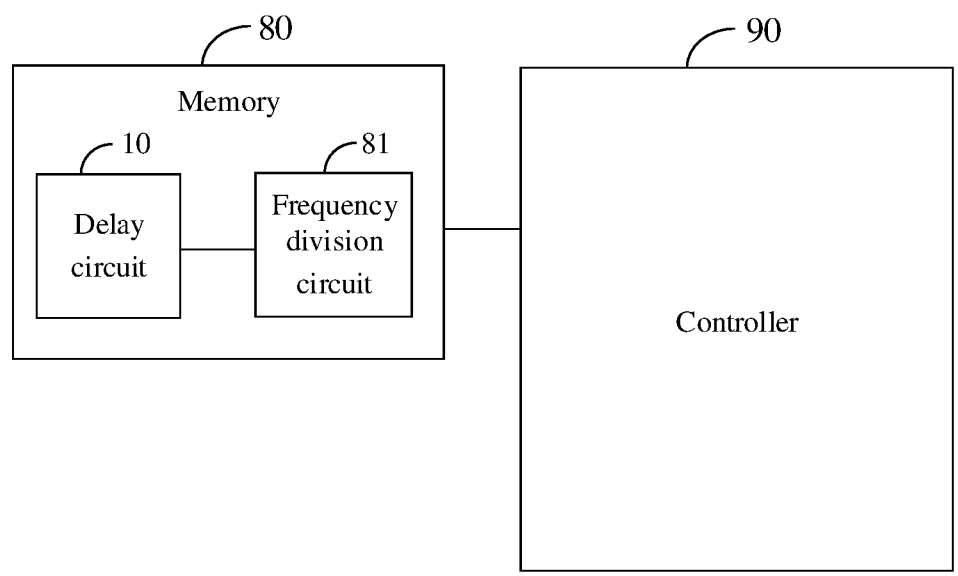
FIG. 19 illustrates a second schematic structural diagram of a memory according to embodiments of the present disclosure.

In some embodiments of the present disclosure, as illustrated in FIG. 19, the memory 80 is electrically connected to a controller 90, where the memory 80 satisfies a 4th-generation double data rate (DDR4) specification and the controller 90 satisfies a 5th-generation double data rate (DDR5) specification. The memory 80 also includes a frequency division circuit 81. The memory 80 is configured to: receive a standard clock signal from the controller 90, divide the standard clock signal into the initial clock signals through the frequency division circuit 81, and transmit the initial clock signals to the delay circuit 10.

In embodiments of the present disclosure, the memory 80 satisfies the DDR4 specification, and the controller 90 satisfies the DDR5 specification. The clock signal frequency under the DDR5 specification is double that under the DDR4 specification. Thus, the standard clock signal received by the memory 80 from the controller 90 complies with the requirements of the DDR5 specification. After dividing the standard clock signal by the frequency division circuit 81 into the initial clock signals, the delay circuit 10 can complete the delay of the initial command signal under the DDR4 specification. That is, under the DDR4 specification, the memory 80 can be compatible with an external controller 90 of the DDR5 specification, thereby increasing the use range of the memory 80.

At the same time, since the frequency of the clock signal is too high under the DDR5 specification, the frequency division clock signal can be used to register and delay the read command. Thus, through the delay circuit 10 according to the previous embodiments, it can be ensured that the effective pulse widths of the read command before and after the delay processing are equal to each other, and the accuracy of signal processing can be improved.

It should be noted that, in the present disclosure, the terms "comprising", "including" or any other variant thereof are intended to encompass non-exclusive inclusion. Thus, a process, method, article or device including a set of elements includes not only those elements, but also other elements that are not explicitly listed, or also elements inherent to such process, method, article or device. In the absence of further limitations, an element defined by the phrase "includes a . . . " does not preclude the existence of additional identical elements in the process, method, article or device in which it is included.

The aforementioned serial numbers of the embodiments of the present disclosure are for description only, and do not represent the advantages and disadvantages of the embodiments. The methods disclosed in the several method embodiments provided in the present disclosure can be arbitrarily combined without conflict, to obtain new method embodiments. Features disclosed in several product embodiments provided in the present disclosure can be arbitrarily combined without conflict, to obtain new product embodiments. Features disclosed in several method or device embodiments provided in the present disclosure can be arbitrarily combined without conflict, to obtain new method or device embodiments.

The aforementioned are merely detailed description of the present disclosure, but the scope of protection of the present disclosure is not limited thereto. Changes or substitutions that would readily occur to those skilled in the art within the technical scope of the present disclosure should be covered within the scope of protection of the present disclosure. Therefore, the scope of protection of the present disclosure shall be subject to the scope of protection of the claims.

The embodiments of the present disclosure provide a delay circuit and a memory. The delay circuit includes a self-shielding circuit and a delay. The self-shielding circuit is configured to: receive an initial command signal and N initial clock signals, register the initial command signal according to a first initial clock signal among the N initial clock signals that triggers the initial command signal at earliest, shield other N−1 second initial clock signals among the N initial clock signals, and output N intermediate command signals, where N is an integer greater than or equal to 2, and the N initial clock signals have a same frequency and different phases. The delay is electrically connected to the self-shielding circuit, and is configured to receive the N intermediate command signals and the N initial clock signals, and delay and output the N intermediate command signals to obtain a delayed command signal. In the present disclosure, the delay circuit only controls the registering and delay of the command signal through the first initial clock signal, and shields the second initial clock signals. Thus, the error caused by the simultaneous action of the N initial clock signals can be avoided, and the accuracy of signal processing can be improved.

What is claimed is:

1. A delay circuit, comprising:
 a self-shielding circuit, configured to: receive an initial command signal and N initial clock signals, register the initial command signal according to a first initial clock signal among the N initial clock signals that triggers the initial command signal at earliest, shield other N−1 second initial clock signals among the N initial clock signals, and output N intermediate command signals, where N is an integer greater than or equal to 2, and the N initial clock signals have a same frequency and different phases; and
 a delay, electrically connected to the self-shielding circuit, and configured to: receive the N intermediate command signals and the N initial clock signals, and delay and output the N intermediate command signals to obtain a delayed command signal;
 wherein the self-shielding circuit comprises:
 a shielding circuit, configured to receive the N initial clock signals and output N intermediate clock signals; wherein the N intermediate clock signals comprise a first intermediate clock signal that is valid and N−1 second intermediate clock signals that are invalid; and
 a register, electrically connected to the shielding circuit, and configured to: receive the initial command signal and the N intermediate clock signals, register the initial command signal according to the first intermediate clock signal, and obtain and output the N intermediate command signals.

2. The delay circuit of claim 1, wherein the register comprises N self-shielding triggers, each of the N self-shielding triggers is a D flip-flop, and the N intermediate command signals comprise a first intermediate command signal that is valid and N−1 second intermediate command signals that are invalid;
 wherein a first input end of each of the N self-shielding triggers is configured to receive the initial command signal, and a second input end of each of the N self-shielding triggers is connected to an output end of the shielding circuit;
 wherein a first self-shielding trigger among the N self-shielding triggers that receives the first intermediate clock signal is configured to register the initial command signal according to the first intermediate clock signal, and a first output end of the first self-shielding trigger is configured to output the first intermediate command signal; and
 wherein other N−1 second self-shielding triggers among the N self-shielding triggers are configured to receive the N−1 second intermediate clock signals at one-to-one correspondence, and first output ends of the N−1 second self-shielding triggers are configured to output the N−1 second intermediate command signals at one-to-one correspondence.

3. The delay circuit of claim 2, wherein the shielding circuit comprises N AND gates, and each of the N AND gates comprises a first input end and N−1 second input ends;
 wherein first input ends of the N AND gates are configured to receive the N initial clock signals at one-to-one correspondence, and output ends of the N AND gates are connected to second input ends of the N self-shielding triggers at one-to-one correspondence; and
 wherein for each of the N AND gates, the N−1 second input ends of the N AND gate are respectively connected to second output ends of N−1 self-shielding triggers other than a self-shielding trigger corresponding to the AND gate.

4. The delay circuit of claim 2, wherein the shielding circuit comprises N inverters and N NOR gates, and each of the NOR gates comprises a first input end and N−1 second input ends;
 wherein input ends of the N inverters are configured to receive the N initial clock signals at one-to-one correspondence, output ends of the N inverters are connected to first input ends of the N NOR gates at one-to-one correspondence, and output ends of the N NOR gates are connected to the second input ends of the N self-shielding triggers at one-to-one correspondence; and
 wherein for each of the N NOR gates, the N−1 second input ends of the N NOR gate are connected to first output ends of N−1 self-shielding triggers other than a self-shielding trigger corresponding to the NOR gate.

5. The delay circuit of claim 2, wherein the delay comprises M stages of second registers, M being an integer greater than or equal to 2; each of the M stages of second registers comprises N delay triggers, and each of the N delay triggers is a D flip-flop;
 wherein second input ends of the N delay triggers in each of the M stages of second registers are configured to receive the N initial clock signals at one-to-one correspondence;
 wherein first input ends of N delay triggers in a first stage of second register are connected to first output ends of the N self-shielding triggers at one-to-one correspondence; and
 wherein first input ends of the N delay triggers in an ith stage of second register are respectively connected to output ends of N delay triggers in a stage of second register immediately previous to the ith stage of second register, and i is greater than 1 and less than or equal to M.

6. The delay circuit of claim 5, wherein M=(CL−A)/N, CL is a maximum number of delay periods, and A is a number of periods corresponding to a command pre-operation.

7. The delay circuit of claim 5, wherein the delay further comprises an OR gate, and the OR gate comprises N input ends; and
 wherein first output ends of the N delay triggers in an Mth stage of second register are connected to the N input ends of the OR gate at one-to-one correspondence, and an output end of the OR gate is configured to output the delayed command signal.

8. The delay circuit of claim 1, wherein N=2, the N initial clock signals are odd-even frequency division clock signals, and the odd-even frequency division clock signals comprise an odd clock signal and an even clock signal; wherein the odd clock signal has a same frequency as the even clock signal, and has a phase opposite to a phase of the even clock signal.

9. The delay circuit of claim 8,
wherein the register comprises a first self-shielding trigger and a second self-shielding trigger, and each of the first self-shielding trigger and the second self-shielding trigger is a D flip-flop; and
wherein a first input end of the first self-shielding trigger and a first input end of the second self-shielding trigger are configured to receive the initial command signal.

10. The delay circuit of claim 9, wherein the shielding circuit comprises a first AND gate and a second AND gate, and each of the first AND gate and the second AND gate has two input ends;
wherein a first input end of the first AND gate is configured to receive the even clock signal, an output end of the first AND gate is connected to a second input end of the first self-shielding trigger, and a second input end of the first AND gate is connected to a second output end of the second self-shielding trigger; and
wherein a first input end of the second AND gate is configured to receive the odd clock signal, an output end of the second AND gate is connected to a second input end of the second self-shielding trigger, and a second input end of the second AND gate is connected to a second output end of the first self-shielding trigger.

11. The delay circuit of claim 9, wherein the shielding circuit comprises a first inverter, a second inverter, a first NOR gate and a second NOR gate, and each of the first NOR gate and the second NOR gate has two input ends;
wherein an input end of the first inverter is configured to receive the even clock signal, and an output end of the first inverter is connected to a first input end of the first NOR gate;
wherein an output end of the first NOR gate is connected to a second input end of the first self-shielding trigger, and a second input end of the first NOR gate is connected to a first output end of the second self-shielding trigger;
wherein an input end of the second inverter is configured to receive the odd clock signal, and an output end of the second inverter is connected to a first input end of the second NOR gate; and
wherein an output end of the second NOR gate is connected to a second input end of the second self-shielding trigger, and a second input end of the second NOR gate is connected to a first output end of the first self-shielding trigger.

12. A memory comprising a delay circuit, the delay circuit comprises:
a self-shielding circuit, configured to: receive an initial command signal and N initial clock signals, register the initial command signal according to a first initial clock signal among the N initial clock signals that triggers the initial command signal at earliest, shield other N−1 second initial clock signals among the N initial clock signals, and output N intermediate command signals, where N is an integer greater than or equal to 2, and the N initial clock signals have a same frequency and different phases; and
a delay, electrically connected to the self-shielding circuit, and configured to: receive the N intermediate command signals and the N initial clock signals, and delay and output the N intermediate command signals to obtain a delayed command signal; and wherein the self-shielding circuit comprises:
a shielding circuit, configured to receive the N initial clock signals and output N intermediate clock signals; wherein the N intermediate clock signals comprise a first intermediate clock signal that is valid and N−1 second intermediate clock signals that are invalid; and
a register, electrically connected to the shielding circuit, and configured to: receive the initial command signal and the N intermediate clock signals, register the initial command signal according to the first intermediate clock signal, and obtain and output the N intermediate command signals.

13. The memory of claim 12, wherein the register comprises N self-shielding triggers, each of the N self-shielding triggers is a D flip-flop, and the N intermediate command signals comprise a first intermediate command signal that is valid and N−1 second intermediate command signals that are invalid;
wherein a first input end of each of the N self-shielding triggers is configured to receive the initial command signal, and a second input end of each of the N self-shielding triggers is connected to an output end of the shielding circuit;
wherein a first self-shielding trigger among the N self-shielding triggers that receives the first intermediate clock signal is configured to register the initial command signal according to the first intermediate clock signal, and a first output end of the first self-shielding trigger is configured to output the first intermediate command signal; and
wherein other N−1 second self-shielding triggers among the N self-shielding triggers are configured to receive the N−1 second intermediate clock signals at one-to-one correspondence, and first output ends of the N−1 second self-shielding triggers are configured to output the N−1 second intermediate command signals at one-to-one correspondence.

14. The memory of claim 13, wherein the shielding circuit comprises N AND gates, and each of the N AND gates comprises a first input end and N−1 second input ends;
wherein first input ends of the N AND gates are configured to receive the N initial clock signals at one-to-one correspondence, and output ends of the N AND gates are connected to second input ends of the N self-shielding triggers at one-to-one correspondence; and
wherein for each of the N AND gates, the N−1 second input ends of the N AND gate are respectively connected to second output ends of N−1 self-shielding triggers other than a self-shielding trigger corresponding to the AND gate.

15. The memory of claim 13, wherein the shielding circuit comprises N inverters and N NOR gates, and each of the NOR gates comprises a first input end and N−1 second input ends;
wherein input ends of the N inverters are configured to receive the N initial clock signals at one-to-one correspondence, output ends of the N inverters are connected to first input ends of the N NOR gates at one-to-one correspondence, and output ends of the N NOR gates are connected to the second input ends of the N self-shielding triggers at one-to-one correspondence; and
wherein for each of the N NOR gates, the N−1 second input ends of the N NOR gate are connected to first output ends of N−1 self-shielding triggers other than a self-shielding trigger corresponding to the NOR gate.

16. The memory of claim 13, wherein the delay comprises M stages of second registers, M being an integer greater than or equal to 2; each of the M stages of second registers comprises N delay triggers, and each of the N delay triggers is a D flip-flop;

wherein second input ends of the N delay triggers in each of the M stages of second registers are configured to receive the N initial clock signals at one-to-one correspondence;

wherein first input ends of N delay triggers in a first stage of second register are connected to first output ends of the N self-shielding triggers at one-to-one correspondence; and wherein first input ends of the N delay triggers in an ith stage of second register are respectively connected to output ends of N delay triggers in a stage of second register immediately previous to the ith stage of second register, and i is greater than 1 and less than or equal to M.

17. The memory of claim 12, wherein N=2, the N initial clock signals are odd-even frequency division clock signals, and the odd-even frequency division clock signals comprise an odd clock signal and an even clock signal; wherein the odd clock signal has a same frequency as the even clock signal, and has a phase opposite to a phase of the even clock signal.

18. The memory of claim 12, wherein the memory is electrically connected to a controller, the memory satisfies a 4th-generation double data rate (DDR4) specification, and the controller satisfies a 5th-generation double data rate (DDR5) specification; and the memory further comprises a frequency division circuit; wherein the memory is configured to receive a standard clock signal from the controller, divide the standard clock signal into the initial clock signals through the frequency division circuit, and transmit the initial clock signals to the delay circuit.

\* \* \* \* \*